May 28, 1968 R. A. CURRAN 3,385,732

ELECTRIC CIRCUIT STRUCTURE

Original Filed May 21, 1962 2 Sheets-Sheet 1

INVENTOR.

BY Robert A. Curran

Robert E. Corb
ATTORNEY

INVENTOR.

BY Robert A. Curran

Robert E. Corb
ATTORNEY

United States Patent Office 3,385,732

Patented May 28, 1968

3,385,732

ELECTRIC CIRCUIT STRUCTURE

Robert A. Curran, Wayland, Mass., assignor, by mesne assignments, to The First Safe Deposit National Bank of New Bedford, New Bedford, Mass., a national banking association Original application May 21, 1962, Ser. No. 196,319, now Patent No. 3,330,695. Divided and this application Aug. 22, 1966, Ser. No. 594,295
18 Claims. (Cl. 117—212)

This application is a division of application Ser. No. 196,319, filed May 21, 1962 now Patent Number 3,330,695.

This invention relates to electric circuit structures and more particularly to novel and improved "printed" wiring arrays and to methods of making such structures.

One of the most widely employed type of electric circuit structure now in use is the so-called "printed circuit" characterized by conductive elements applied to an electrically non-conducting support. While a large number of different insulating materials are employed as substrates for printed circuitry, the material most generally used is resin-impregnated fiberboard employed because of its mechanical toughness as well as its dielectric qualities. However, other characteristics of such materials, particularly their physical and chemical properties and problems of fabrication have presented their use in many applications, particularly those requiring heat dissipation and/or involving high temperatures and certain operating environments.

The limitations of the various insulating materials useful as printed circuitry substrates has pointed up the many advantages to be derived by employing metallic materials as substrates for printed circuits. Most of the advantages are well known and have been enumerated frequently including, for example, mechanical strength, toughness and rigidity; ease and accuracy of fabrication and assembly; weight; immunity to temperature extremes; electrical conductivity and hence utility as a component of the circuit (e.g., ground plane); and good heat conductivity and hence utility as heat sinks. However, the provision of printed circuits on metallic substrates has presented a number of problems, particularly the formation of dielectric barriers between the substrate and the conductive pathways, the production of composite structures which are mechanically, physically and chemically tough and stable, and retain their integrity and remain operative over a wide range of operating conditions.

An object of the invention is to provide a novel and improved printed circuit structure including a metal substrate, characterized by a construction which is inexpensive, reliable and inherently capable of manufacture by methods which are easier, involve fewer operations and lend themselves to performance by automatically operated equipment.

Another object of the invention is to provide a printed circuit structure including a metal substrate in which the insulating material between the metal substrate and the metal conducting elements affords greater protection for the metal substrate, higher dielectric strength, and more secure and reliable bonding between the substrate, insulating material and conducting elements.

A further object of the invention is to provide printed circuit structures having greater current carrying ability, and utility under more extreme conditions of temperature and environment than existing metal substrate circuit structures.

Still another object of the invention is to provide a method of manufacturing a printed circuit which: is easy to perform; involves a minimum of inexpensive, rapidly completed operations; lends itself to mass production methods by automatic machinery; is readily adaptable to the production of different circuit structures and changes in design thereof and circuit components such as resistors, capacitors, switches, and heating elements; permits the use of a wide variety of materials in each step in the manufacturing method; and is amenable to use with substrates of almost any configuration to produce continuous conducting pathways on other than plane surfaces.

A still further object of the invention is to provide a method of producing printed circuit structures including multiple arrays of conducting pathways arranged in overlying layers, and insulated from one another with conducting pathways electrically connected to one another and to the metal substrate as desired.

Other objects of the invention will in part be obvious and will in part appear hereinafter.

The invention accordingly comprises the several steps and the relation and order of one or more of such steps with respect to each of the others, and the product possessing the features, properties and the relation of elements which are exemplified in the following detailed disclosure, and the scope of the application of which will be indicated in the claims.

Figures 5, 6, 7, 8, 9:
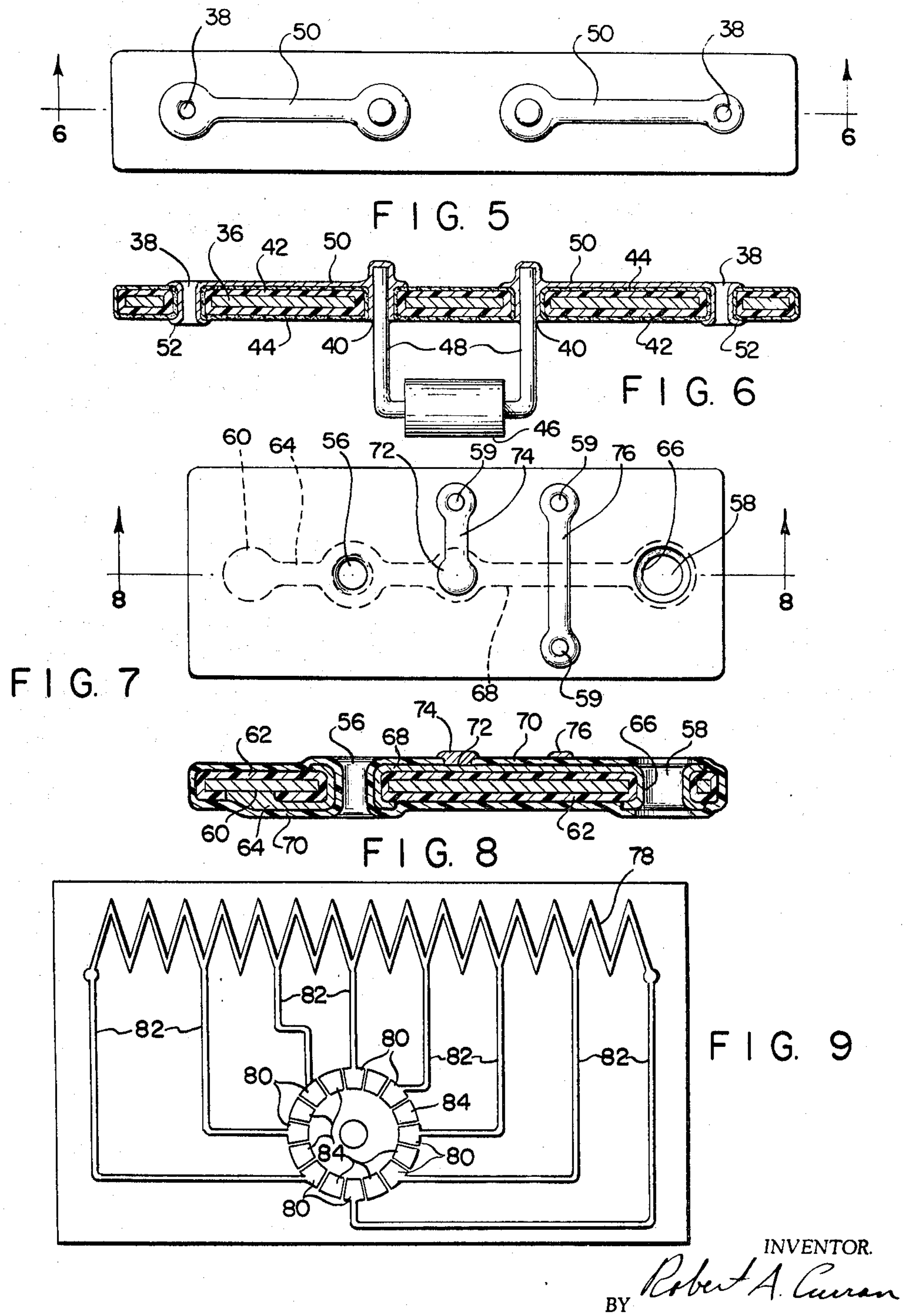
FIG. 5 is a plan view of a circuit structure illustrating another embodiment of the invention.
FIG. 6 is a sectional view taken along the line 6—6 of FIG. 5.
FIG. 7 is a plan view of a circuit structure illustrating a further embodiment of the invention.
FIG. 8 is a sectional view taken along the line 8—8 of FIG. 7.
FIG. 9 is a plan view of a heating element and switch chassis illustrating the invention.

Especially useful as printed wiring support structures are the metals, because of their mechanical characteristics of strength, toughness, rigidity and dimensional stability, making them useful as structural elements as well as circuit substrates; their ability to maintain these mechanical characteristics at relatively high temperatures; their ease of fabrication; and their relative cost as compared to more widely employed non-metallic substrates. A particularly useful metal, for example, is aluminum and its alloys, desirable because of its high strength-to-weight ratio and its good electrical and heat conducting properties, but presenting a number of fabrication problems heretofore solvable only with considerable difficulty.

The metal support structure must be provided with a coating required to perform a number of functions, principally, acting as a dielectric between the metal support and the conducting pathways, as a tough protective covering for the metal and as a support securely adhered to the metal and to which the conducting elements may be applied and are securely bonded. To perform these functions, the coating must have a high dielectric strength; it must be heat resistant, chemically inert and exhibit both structural strength and resistance to abrasion and mechanical penetration; it should be continuous and non-porous; it must be capable of bonding securely to the metal support and remaining bonded under all operating conditions; and it must provide an outer surface to which the conducting elements may be applied by conventional techniques and which will retain the conducting elements under all operating conditions. In addition to the foregoing properties, the coating should be susceptible to application to substantially any surface configuration of any metal, by techniques that are easy to employ, are inexpensive and lend themselves to performance by automatic equipment.

The protective, dielectric support coating of the invention meets these criteria and generally comprises two integrated and mutually cooperative layers including a layer of a coating compound adhered to the metal support and a coating thereon of a very hard, inert material embedded in a layer of coating compound and providing a supporting surface for receiving and securely retaining metal conducting elements applied thereto. The layer of coating compound provides the firm bond between the metal support and support coating, acts as a continuous, tough yet flexible, non-porous protective covering for the metal, is a dielectric barrier and provides a support for the outer coating. This outer coating is composed of finely divided particles of an extremely hard, inert, inorganic, dielectric material firmly embedded in coating compound, and providing a hard abrasive and penetration resistant, dielectric coating for the layer of coating compound, having a rough surface with interstices between particles forming a support capable of effectively retaining metal conducting elements applied, for example, by spraying the metal in a molten condition so that it fuses to the coating and fills the interstices.

The support coating is designed to cover the metal base completely and continuously except only those areas of the base where electrical contact is to be made; and lends itself to the easy application to support structures of almost any configuration for coating all of the accessible surfaces thereof. The metal support structure can be completely fabricated, preferably prior to subsequent operations, by conventional metal-working practices without the necessity of forming especially fine finishes on or chemical treatment of those surfaces which are to support conducting elements. Any metal or alloy can be employed, the choice thereof being dictated by the particular mechanical and physical properties desired, rather than by the chemical properties of the metal. The surfaces of the metal require no special cleaning or preparing operations such as is required of metals which are to be provided with anodic or other electrically and/or chemically applied coatings. The only requirement is that such surfaces be free of major contaminants such as grease and oil which may interfere with the adherence of an organic plastic material to the metal surfaces. Because surface finishes are far from critical and no special surface cleansing and preparation is required, the fabrication of the metal support structures comprising the bases for circuitry manufactured according to the invention is an inexpensive operation which can be performed by mass production methods with conventional automated metal working equipment.

To the metal base is applied a layer of a coating compound the choice of which is also dictated by the end use for which and the conditions under which the completed circuit structure is to be employed. The primary factors determining the choice of materials include operating temperature and environment, and the dielectric strength required, although the last may be considered a minor problem where the thickness of the layer of coating compound is not a major factor. The expression "coating compound" is employed herein to mean any of a large group of compounds, usually organic, which are capable of forming solid films or coatings; and including materials generally termed "organic plastics," for example, resins (both synthetic and natural) polymers; elastomers; petroleum distillation products; and organosilicon compounds, principally polymerized organic siloxanes in the form of resins or elastomers. In embodiments in which heat is not a factor, the thermoplastic organic plastic compounds may find utility; with the choice of particular compound being dictated by other properties such as cost, dielectric strength, hardness, toughness, flow characteristics, melting temperature, wear and abrasion resistance, impact resistance, chemical stability and resistance to particular chemicals, stability in the presence of particular radiation, and adhesion characteristics with respect to a particular metal. On the other hand, where heat resistance, either during manufacture (e.g., during dip soldering), or subsequent operation is a factor, the thermosetting plastics are indicated, with the particular choice being dictated by the considerations already noted together with such other factors as curing time and temperature. Because the layer of coating compound is protected against wear, impact and penetration by an outer coating, it is possible to employ many materials having desirable chemical and/or electrical properties, the use of which might otherwise be precluded by their mechanical properties.

The layer of coating compound, in the case of an organic plastic material, can be applied by any of the conventional coating methods including, for example, solution coating and fluidized bed coating. The latter system is preferred for a number of reasons and involves preheating the metal base to at least the melting or fusion temperature of the plastic material and dipping the base in a bed of finely divided fluidized plastic powder. Fluidization of the plastic powder is produced by an ascending current of gas or air in a tank containing the powder. The plastic powders contact the heated base and fuse to one another and the base to form a layer the thickness of which is uniform and can be closely controlled, being dependent on the temperature of the metal base, the heat content thereof and the emersion time within the fluidized bed. The coating process lends itself to automatic production methods and is useful for any plastic material which can be melted, the cellulosics, vinyls and epoxys being the materials currently enjoying wide use in the electrical industry. In instances in which the plastic material is thermosetting, it is applied to the support structure while in a solid, partially cured or thermoplastic state and curing is completed at a later stage in the manufacture of the printed circuit structure.

While the invention finds particular utility in connection with the use of metal substrates, the use of fluidized bed coating techniques for applying the organic plastic layer make it possible to utilize as the base support, almost any material which can be heated to the melting temperature of the plastic and to which the plastic will adhere. Such materials include glass, ceramics and where flexible printed circuitry is desired, metallic and glass fabrics, both having desirable properties to recommend them. The fluidized bed coating technique is preferred because it enables the formation of a uniform, continuous, non-porous layer on complex surface configurations including sharp edges, corners and projections and, accordingly, places little or no limitation on the design of wiring panels and electrical chassis.

The problems of electrical insulation, metal support protection and bonding between the metal support and its protective coating being solved by the layer of coating compound, preferably an organic plastic material, the next problems to be solved are those relating to providing a protective coating for the plastic material and applying and adhering the metal conducting elements to the supporting substrate. Both of these problems find their solution in a coating of finely divided, hard, inert, inorganic dielectric material embedded in the layer of plastic material. Materials preferred for this coating include metallic oxides such as the oxides of aluminum, titanium, zirconium and copper, glass and quartz. The materials suggested are characterized by their hardness and abrasive resistance and in fact, it will be noted, include many materials commonly employed as abrasives. The individual particles, while being small, (e.g., 270 mesh) are preferably irregularly shaped with sharp corners and edges to provide a better foundation for the metal conductors as well as adherence to the layer, (organic plastic), of coating compound.

The methods are suggested for applying the hard particle coating to organic plastic layers, both methods being designed to insure that the particles are embedded in the plastic material and lend themselves to automatic production methods. In one method, the particles are sprayed against the plastic material at a temperature at least equal to the melting temperature of the plastic material while the latter is still in a thermoplastic condition, to cause the particles to become embedded in the plastic material. Equipment is readily available together with metal oxides for performing this operation which may also result in some fusion of oxide particles to one another so that comparatively thick coating may be built up by this method.

The other method of applying the hard particle coating to the organic plastic material involves dipping the plastic coated support into a fluidized bed of the coating material while the plastic is in a liquid or molten condition. This can be performed with solution coated plastics but is preferably accomplished by immersing the preheated support in a fluidized bed of the hard particle coating material immediately after removal from the fluidized bed of the plastic material while the plastic material adhering to the metal is still in a molten condition. The hard particles in the fluidized bed adhere to and become embedded in the molten plastic and like the particles applied by spraying, are virtually inseparable from the layer of plastic material. The coating of hard particles provides a surface which is rough, irregular, and while it may be porous and have interstices, is essentially continuous insofar as protection of the plastic material against wear, abrasion and mechanical penetration is concerned. The thickness of the protective coating including the layer of plastic material and the coating of hard particles may be varied to suit the particular requirements of a circuit structure, especially the dielectric properties, and may range, for example, from .004 inch to .012 inch, with the plastic layer ranging from .002 to .009 inch in thickness and the hard particle coating adding an additional .001 to .003 inch to the total thickness of the coating.

During application of the organic plastic layer and the coating of hard particles, areas of the metallic support to which electrical contact is to be made, are masked to prevent coating. The masking material can be adhered to the metal and later removed or, in a preferred method, the masking may be performed by the means associated with or comprising the means employed to grip and hold the metal support member while it is being coated.

The metal conducting elements are applied to the hard particle coating as finely divided particles at a temperature above the melting temperature of the metal by conventional methods such as spraying and vacuum deposition so that the metal particles fuse to one another to form continuous conducting elements. The metal particles are sprayed or otherwise propelled against the coating so that they fill the interstices between the particles comprising the coating, and generally surround and become bonded to the hard particles, with the result that the coating and metal conducting elements become virtually inseparable. The effect of the combination of coatings is to provide hard particles embedded in both the layer of plastic material and the metal conducting elements thereby anchoring the conducting elements to the plastic layer. The method of the invention permits conducting elements to be formed of any metal or alloy which can be applied by spraying or vacuum deposition methods, including many metals and alloys which cannot, for a number of reasons, be employed in printed circuitry produced by the usual methods currently being employed. Spraying of the conducting elements has the additional advantages of accuracy with regard to both dimensions and thickness; and the ease with which the conducting elements are applied to other than plane surfaces including intersections of angularly disposed surfaces such as are found at edges, corners, holes, and the like.

The metal conducting elements are applied by spraying through masks having openings arranged in the pattern of the conductive pathways to be formed. Where a through connection is to be made between two conducting elements on opposite faces of a support panel, the latter is formed with a through hole, both faces of the panel and the wall (or walls) of the hole are coated with a continuous, uninterrupted layer of plastic material in which a coating of hard particles is embedded, masks are located adjacent opposite faces of the panel with openings in the masks aligned with the hole, and the metal forming the conducting elements is sprayed through the masks against the opposite faces of the panel to form the conducting elements and coat the wall of the hole to provide a continuous electrical pathway disposed on opposite faces of the panel and extending uninterruptedly through the hole.

When multilayer circuitry is desired, a circuit structure is produced as described, including a first circuit array of conducting elements and then is coated all over with a second layer of organic plastic material in which is embedded a coextensive coating of hard particles. The second plastic layer and hard particle coating is continuous and substantially without interruption, as is the first layer and coating, except for areas of the support and/or the conducting elements of the first circuit array at which electrical contact is to be made with a second, or subsequent, circuit array applied by spraying to the second plastic layer and hard particle coating. Additional circuit arrays are formed in the same manner, each being supported on a plastic layer and hard particle coating applied to the previous circuit array.

In embodiments in which eyelets are preferred for making through connections or for mounting circuit components, the combined plastic layer and hard particle coating embedded therein provide an insulating layer between the metal support panel and eyelet, having exceptional mechanical and dielectric properties which insure against contact between the metal support panel and the eyelet (and possible short circuiting), and allow for high current loads without leakage.

Figure 1:
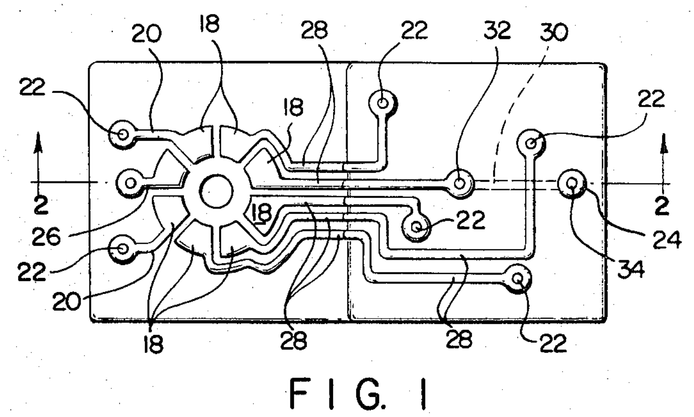
FIGURE 1 is a plan view of an electric circuit structure embodying the invention.
Figures 2, 4:
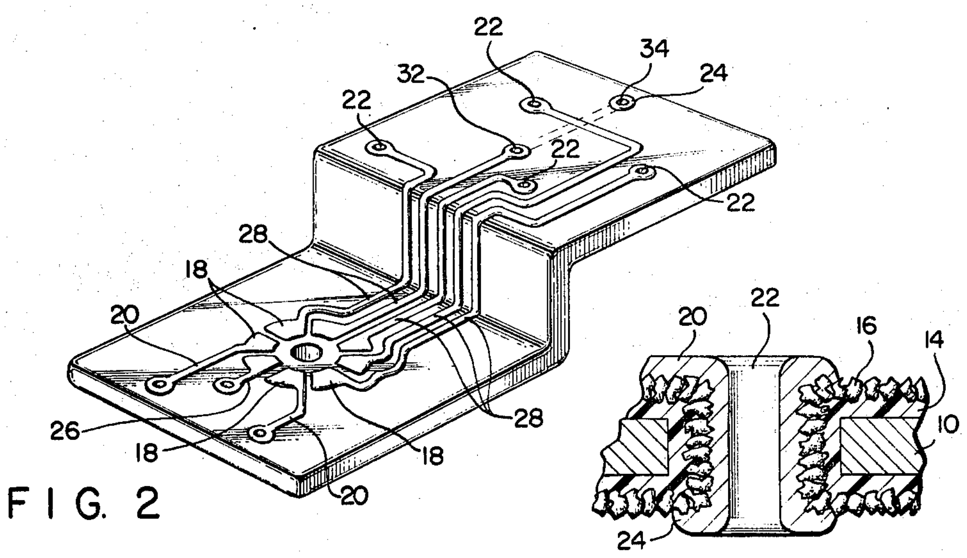
FIG. 2 is a perspective view of the structure of FIGURE 1.
FIG. 4 is an enlarged, fragmentary sectional view illustrating in detail the construction of the circuit structure shown in FIGURE 1.
Figure 3:
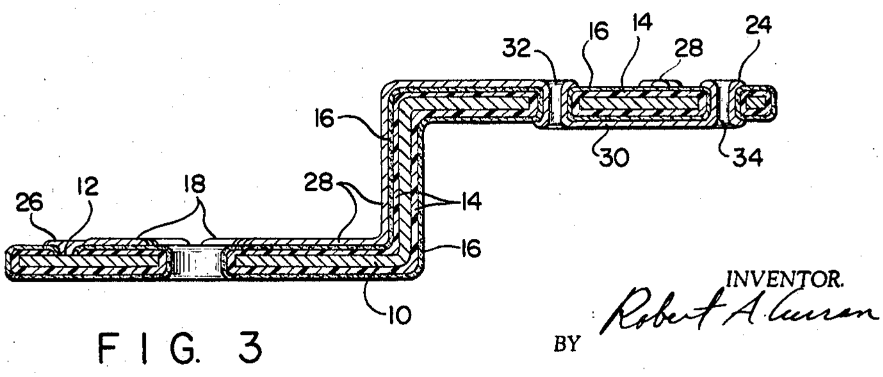
FIG. 3 is a cross-sectional view taken along the line 3—3 of FIGURE 1.

Reference is now made to FIGS. 1 through 3 of the drawings in which is shown a typical circuit structure embodying the invention. The structure shown comprises a metal support panel 10 formed with two 90° bends intermediate its ends to provide three sections including two end sections lying in parallel planes joined by an intermediate section lying in a plane perpendicular to the planes of the end sections. The circuit structure is typical of printed wiring chassis and includes a pattern of switch contacts, and conducting elements arranged in circuit arrays on opposite faces of the panel and extending without interruption around corners and through holes in the panel. With the exception of a small area designated 12, on one surface of panel 10, the support panel is completely covered with a layer 14 of organic plastic material and a coextensive coating 16 of hard particles embedded in layer 14.

The circuit array includes a pattern of switch contacts 18 on one face (termed the "front" face) of the panel at an end section thereof, with conducting elements 20 extending from the switch contacts along the face of the end section of the panel supporting the switch contacts. Two of conducting elements 20 are shown extending to holes 22 in the end section of the panel where the metal conducting elements extend through the holes as shown in detail in FIG. 4 to provide what amounts to eyelets 24 to which circuit components may be soldered. One of conducting elements, designated 26, is coupled with the surface of support panel 10 at area 12, and because the connection is made by spraying the molten metal against the support panel, the conducting element is, in effect, welded or brazed to the support panel. Five of the conducting elements, designated 28, extend without interruption across the face of the end section of the panel supporting the switch contacts, make a 90° bend at the inside corner defined by the junction of the end and intermediate sections of the panel, across the intermediate section of the panel to the corner at the other end section, make a 90° bend around this corner and then extend across the front face of the other end section to holes 22 therein.

The panel is provided on its other (rear) face with a single conducting element 30 extending between holes 32 and 34, and through hole 34 to form an eyelet 24 on the front face of the panel. One of conducting elements 28 extends across the front face of the panel to hole 32 where it is connected through hole 32 to conducting element 30 on the rear face of the panel. The through connection, it will be noted, is continuous and without interruption comprising integral portions of the two conducting elements.

The circuit structure shown in FIGS. 5 and 6 illustrates the application of the invention to the mounting of circuit components on a chassis and electrical connection of the components to the "printed" conductive pathways. Both of these operations are combined in the single operation of applying the electrical conducting elements to form, in effect, welded or biased connections between the conducting elements and the leads of the circuit components. The circuit structure shown comprises a support panel 36 formed with holes 38 and 40 covered completely with a layer 42 of plastic material and a coating 44 of hard particles embedded in layer 42. A circuit component such as a resistor 46 is mounted on the rear face of the panel with its leads 48 projecting through holes 34. Two conducting elements 50 are then sprayed onto the front face of the panel, each connected at one end to a lead 48, and extending across the front face of the panel to a hole 32 and through the hole to provide an eyelet 52 on the rear face of the panel to which other circuit components can be connected. The metal particles which form the conducting elements are sprayed against the panel in a molten condition so that they fill holes 40 and are welded or brazed to leads 48 within holes 40, thereby mounting the resistor and electrically connecting its leads to conducting elements formed at the same time in the same operation.

FIGS. 7 and 8 illustrate a multilayer circuit structure comprising a support panel 54 formed with two holes designated 56 and 58, and three holes designated 59, and is completely covered, with the exception of area 60 on its rear face, with a coating, designated 62, comprising a layer of plastic material and a coating of hard particles embedded therein. A circuit element 64 is provided on the rear face of the panel extending from area 60 where it is connected to the panel, to and through hole 56 where element 64 joins with a conducting element 68 on the front face of the panel. Conducting element 68 extends along the front face of the panel to and through hole 58 wherein it forms an eyelet 66 to which electrical connection can be made. A second coating 70 comprising a layer of plastic material with a coating of hard particles embedded therein is applied to the structure so as to completely cover the structure except in an area, designated 72, of conducting element 68 and within eyelet 66. To second coating 70, on the front face of the panel, is applied a conducting element 74 coupled with conducting element 68 at area 72 at one end and extending to and through hole 59. Another conducting element 76 is applied to coating 70 on the front face of the panel and includes end sections extending through holes 59 where they form eyelets on the rear face of the panel.

A heating device including a heater element and a control switch is illustrated in FIG. 9, which, with the exception of the moving switch contacts, is manufactured according to the invention. The device comprises a panel, covered with a layer of a heat resistant organic plastic and a coating of hard particles embedded in the plastic layer. To this covering is applied (by spraying) a high resistance heating element 78 formed of a conventional nickel-chromium alloy. A pattern of switch contacts 80 is provided on the panel together with conductive elements 82, formed of a metal such as copper, connecting the switch contacts with the heating element. In order to prevent the movable switch contact (not shown) from wearing due to contact with the abrasive surface formed by the coating of hard particles intermediate switch contacts 80, a dummy switch contact 84 is provided between each pair of switch contacts 80. Contacts 84 are not connected in any electrical circuit, are insulated from each other and contacts 80, and function only to prevent abrasion of the moving switch contacts by the hard particle coating.

It should be apparent from the foregoing examples and the descriptions thereof, that the method of the invention lends itself readily to the production of a variety of circuit structures and/or circuit components such as resistors, capacitors and inductors; and that the process can be performed by automatic equipment which is easily adapted (without substantial modification) to the production of widely varied circuit structures and components. The operations involved in the production of circuit structures are relatively few in number and are easy and inexpensive to perform; and the product of the method represents an advance in the art meeting the high standards which are the objects of the invention.

Since certain changes may be made in the above process and product without departing from the scope of the invention herein involved, it is intended that all matter contained in the above description or shown in the accompanying drawings shall be interpreted as illustrative and not in a limiting sense.

I claim:

1. An electric circuit structure comprising, in combination:

a support member including a support surface;

a layer of a solidified coating compound adhered directly to said surface;

a coating substantially completely covering said layer and comprising finely divided particles of a hard, infusible, dielectric material embedded in said layer; and a plurality of metallic electric conducting elements fused directly to said coating and arranged in an electric circuit array;

said conducting elements being electrically insulated from each other and from said support member by said layer and said coating thereon.

2. The electric circuit structure of claim 1 in which said coating comprises particles of a dielectric metallic oxide at least partially fused to one another.

3. The electric circuit structure of claim 1 in which said coating compound is a polymeric material.

4. The electric circuit structure of claim 3 in which said polymeric material is thermosetting and is fused to said surface of said support member.

5. The electric circuit structure of claim 1 in which said coating comprises irregularly shaped particles of silicon dioxide.

6. The electric circuit structure of claim 1 in which said conducting elements comprise finely divided metal particles fused to one another and anchored in the interstices between said particles comprising said coating.

7. The electric circuit structure of claim 1 in which said layer and said coating each is of substantially uniform thickness throughout.

8. The electric circuit structure of claim 1 in which one of said conducting elements is a resistance element.

9. The electric circuit structure of claim 1 in which said support member includes angularly related plane surfaces intersecting one another, said layer and said coating cover said surfaces without interruption at said intersection, and at least one of said conducting elements is continuous and is supported, in part, on each of said surfaces.

10. An electric circuit structure as defined in claim 1 in which said support member comprises a panel having opposed faces each provided with a layer of said coating compound and a coating of said finely divided particles of hard, inorganic, dielectric material embedded in said layer and supporting said conducting elements.

11. An electric circuit structure as defined in claim 10 in which said conducting elements are provided on opposite faces of said panel.

12. An electric circuit structure as defined in claim 1 including a second circuit array of metallic electric conducting elements fused to a second coating of said finely divided particles of hard, infusible, dielectric material embedded in a second layer of said coating compound adhered directly to the outer surfaces of the first-mentioned coating and first-mentioned conducting elements with at least one of said conducting elements of said second array being coupled with one of said first-mentioned conducting elements in an area thereof free of said second layer and said second coating.

13. An electric circuit structure comprising, in combination:

- a metal support member;
- a layer of polymeric material adhered directly to said support member and completely covering said support member except for predetermined areas thereof at which electrical contact is made with said support member;
- a coating completely covering said layer of polymeric material and comprising finely divided particles of a hard, infusible, dielectric material embedded in said layer;
- a plurality of metallic conducting element arranged in an electric circuit array fused directly to said coating and to said support member in said predetermined areas thereof;

said conducting elements being electrically insulated from each other and from said support member by said layer of polymeric material and said coating thereon.

14. An electric circuit structure as defined in claim 13 in which said panel is formed with openings extending therethrough, said layer of polymeric material and said coating thereon extend without interruption through said holes and are adhered to the walls thereof, and at least two of said conducting elements are supported on opposite faces of said panel and include integral portions fused to said coating within said holes and electrically connecting the last-mentioned conducting elements.

15. An electric circuit structure comprising, in combination:

- a metal panel having opposed faces and formed with holes extending through said panel to said faces;
- a substantially continuous layer of a solidified coating compound adhered directly to said panel and completely covering said panel including portions thereof defining said holes and excepting predetermined areas of said panel at which electrical connection is made with said panel;
- a coating completely covering said layer and comprising finely divided particles of a hard, infusible, dielectric material embedded in said layer;
- a circuit component mounted on one face of said panel and including leads extending through said holes to the opposite face of said panel; and
- a plurality of metallic electric conducting elements arranged in a circuit array on said opposite face fused directly to said coating and to said leads;

said conducting elements being electrically insulated from each other and said support member by said layer and said coating thereon extending into said holes in said panel.

16. The electric circuit structure of claim 15 in which said coating compound is a polymeric material.

17. The electric circuit structure of claim 16 in which said polymeric material is thermosetting and is fused to said metal panel.

18. The electric circuit structure of claim 15 in which said conducting elements comprise finely divided metal particles fused to one another and to said leads and anchored in the interstices between said particles comprising said coating.

References Cited

UNITED STATES PATENTS

| | | | |
|---|---|---|---|
| 2,848,359 | 8/1958 | Talney | 117—212 X |
| 2,861,911 | 11/1958 | Martin et al. | 117—212 X |
| 2,910,351 | 10/1959 | Szpak et al. | 117—212 X |
| 3,259,559 | 7/1966 | Schneble et al. | 117—212 X |
| 3,294,576 | 12/1966 | Geraghty | 117—212 X |

RALPH S. KENDALL, *Primary Examiner.*

A. GRIMALDI, *Assistant Examiner.*